(12) United States Patent
Chen et al.

(10) Patent No.: US 10,192,589 B2
(45) Date of Patent: Jan. 29, 2019

(54) COMPACT TOOL-LESS HARD DRIVE DISK CARRIER

(71) Applicant: Quanta Computer Inc., Taoyuan (TW)

(72) Inventors: Chao-Jung Chen, Taoyuan (TW); Yaw-Tzorng Tsorng, Taoyuan (TW); Chun Chang, Taoyuan (TW); Chu-Lin Huang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 15/402,175

(22) Filed: Jan. 9, 2017

(65) Prior Publication Data

US 2018/0197579 A1    Jul. 12, 2018

(51) Int. Cl.
| | |
|---|---|
| *G11B 33/00* | (2006.01) |
| *G11B 33/12* | (2006.01) |
| *G06F 1/18* | (2006.01) |
| *G11B 33/02* | (2006.01) |
| *G06F 1/16* | (2006.01) |
| *H05K 7/14* | (2006.01) |

(52) U.S. Cl.
CPC .............. *G11B 33/005* (2013.01); *G06F 1/16* (2013.01); *G06F 1/18* (2013.01); *G06F 1/187* (2013.01); *G11B 33/022* (2013.01); *G11B 33/124* (2013.01); *G11B 33/128* (2013.01); *H05K 7/14* (2013.01)

(58) Field of Classification Search
None
See application file for complete search history.

(56) References Cited

U.S. PATENT DOCUMENTS

| | | | | |
|---|---|---|---|---|
| 6,288,902 B1* | 9/2001 | Kim | ....................... | G11B 33/08 |
| | | | | 206/701 |
| 9,462,717 B1* | 10/2016 | Senatori | .................. | G06F 1/187 |
| 9,648,773 B1* | 5/2017 | An | .......................... | G06F 1/187 |
| 9,699,931 B1* | 7/2017 | Chen | ..................... | H05K 7/1489 |
| 2008/0239657 A1* | 10/2008 | Oyama | ................... | G06F 1/183 |
| | | | | 361/679.37 |
| 2011/0141685 A1* | 6/2011 | Hung | .................... | G06F 1/1632 |
| | | | | 361/679.43 |
| 2012/0087084 A1* | 4/2012 | Nguyen | ................. | G06F 1/187 |
| | | | | 361/679.37 |

(Continued)

*Primary Examiner* — Binh B Tran
*Assistant Examiner* — Douglas R Burtner
(74) *Attorney, Agent, or Firm* — Nixon Peabody LLP; Eduardo J. Quiñones; Zhou Lu

(57) ABSTRACT

A computing device is provided with a drive slot with a connector for engaging a corresponding connector of a HDD, and a first locking element. The computing device includes a removable a HDD carrier for insertion into the drive slot having a bracket, a handle and an enclosure slidably attached to the bracket for securing the HDD. The handle includes a second locking element extending therefrom and configured to receive the first locking element to restrict the removable HDD carrier to vertical motion. The first locking element engages with the second locking element when the handle is in the loading position and the bracket moves relative to the enclosure to secure the hard disk drive in the bracket and connect the connector of a hard disk drive to the connector located at the drive slot when the handle transitions from the loading position to the locked position.

14 Claims, 8 Drawing Sheets

(56) References Cited

U.S. PATENT DOCUMENTS

| | | | | |
|---|---|---|---|---|
| 2013/0119837 A1* | 5/2013 | Gong | .................. | G06F 1/187 |
| | | | | 312/223.2 |
| 2014/0205394 A1* | 7/2014 | Chao | .................. | G11B 33/128 |
| | | | | 411/132 |
| 2015/0201520 A1* | 7/2015 | Jau | .................. | G06F 1/187 |
| | | | | 211/26 |
| 2016/0042768 A1* | 2/2016 | Yang | .................. | G11B 33/128 |
| | | | | 403/322.4 |
| 2016/0073537 A1* | 3/2016 | Tseng | .................. | G06F 1/1658 |
| | | | | 361/809 |

* cited by examiner

COMPACT TOOL-LESS HARD DRIVE DISK CARRIER

FIELD OF THE INVENTION

The present invention relates to hard drive disk carriers, and more specifically to compact and tool-less hard drive disk carriers.

BACKGROUND

Hard disk drives (HDDs) are commonly utilized to store relatively large amounts of data in today's computer systems. HDDs are especially useful in situations where a user may need to access a relatively large amount of data reasonably quickly, for example, as compared with accessing an archived tape copy. This use is becoming even more commonplace as HDDs become increasingly cheaper while providing a larger storage capacity. Moreover, as the new technologies such as video capturing and digital image storage become more commonplace, large capacity HDDs become an ever more important part of a computer system.

Removing a HDD from many types of computer systems today requires tools and involves pulling cables from cable sockets. Overtime, or through incorrect usage, these cables or sockets become frail and can introduce data transfer errors associated with the HDD in use. Installing a HDD is not any easier because it involves similar hardships.

Furthermore, a computer data center (also referred to as an Internet data center or an enterprise data center) may contain a myriad of computer systems utilizing various HDDs. The large number of high-capacity HDDs in a data center poses significant problems associated with their removal and installation. The time and skills involved in removing or installing HDDs, without damage, in a data center can become burdensome.

Accordingly, it is becoming extremely important for various reasons (such as data backup and generally switching HDDs) to be able to easily, quickly, and efficiently remove and install a HDD in a computer system.

SUMMARY

Embodiments of the invention concern compact and tool-less hard drive disk carriers. A computing device according to the various embodiments can include an enclosure with at least one drive slot, the at least one drive slot including at least one connector for engaging a corresponding connector of a hard disk drive, and a first locking element. The computing device also includes a hard drive carrier for removable insertion into the at least one drive slot.

The hard drive carrier includes a bracket for securing the hard disk drive in a receiving space, an enclosure slidably connected to the bracket and a handle having a second locking element extending therefrom and configured to receive the first locking element of the one drive slot and configured to restrict the removable hard drive carrier to vertical motion when the second locking element engages with the first locking element.

The handle is mechanically attached to one end of the bracket and configured to alternate between a loading position and a locked position. In addition, the handle is pivotally attached to the enclosure such that the enclosure is stationary relative to the bracket. The second locking element engages with the first locking element when the handle is in the loading position to secure the hard disk drive in the bracket. In addition, the connector of the hard disk drive connects to the at least one connector located at the at least one drive slot when the handle transitions from the loading position to the locked position.

In an exemplary embodiment of the computing device, the first locking element can be a hook and the second locking element can be a knob configured to engage with the hook. In an alternative embodiment of the computing device, the second locking element can be a hook and the first locking element can be a knob configured to engage with the hook.

In an exemplary embodiment of the computing device, the bracket can have a plurality of guide pins for receiving and securing the hard disk drive in the receiving space. Furthermore, in an exemplary embodiment of the computing device, the bracket can have a receiving space for receiving the hard disk drive and a plurality of protrusions extending into the receiving space and arranged to correspond with a plurality of indentations of the hard disk drive to secure the hard disk drive in the receiving space.

The computing device can further include at least one latch configured to secure the handle in the locked position.

DETAILED DESCRIPTION

Figure 1A:
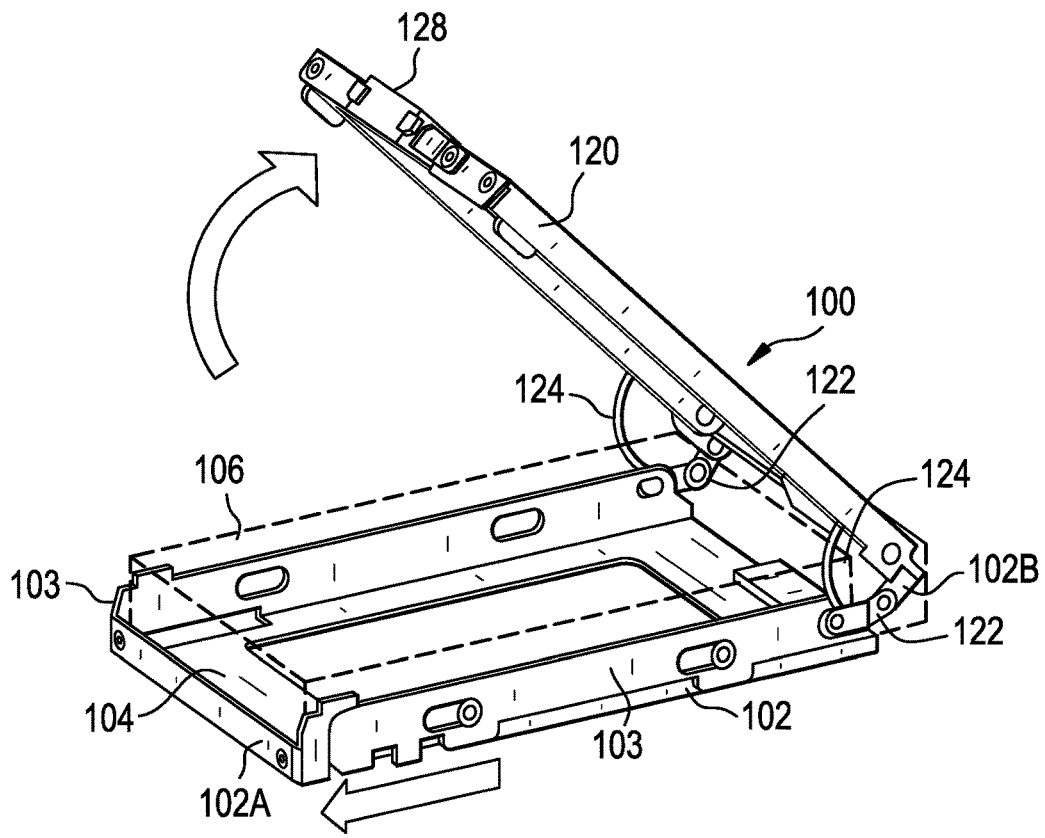
FIGS. 1A, 1B, 1C, and 1D are top isometric, bottom isometric, top and bottom views of a HDD carrier according to an embodiment.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As discussed above, there is significant interest in developing means to efficiently and reliably add or remove a HDD for a computer system. In particular, there is significant interest in developing means that: (1) do not require tools to install a HDD into a computer system; (2) minimize space requirements for the HDD in the computer system; and (3) reduce or eliminate instances of incorrect installation of the HDD, which can result in damage to the HDD, the computer system, or connectors therebetween.

In view of the foregoing, the present disclosure contemplates a HDD carrier design for a computer system and computer systems therefrom that address the foregoing requirements. In particular, the present disclosure contemplates (1) a HDD carrier design that allows a technician to easily and reliably install a HDD in the HDD carrier and (2) a corresponding drive slot design for a computer system that allows mechanical and electrical installation of the HDD in the computer system with minimal effort and training on the part of the technician. Such a design is illustrated in FIGS. 1A-1D.

FIGS. 1A, 1B, 1C, and 1D are top isometric, bottom isometric, top and bottom views of a HDD carrier 100 according to an embodiment. As shown in FIGS. 1A-1D, the HDD carrier 100 includes a bracket 102 with a receiving space 104 for receiving and securing a HDD 106 in a horizontal position, plates 103 slidably attached to the bracket 102, and pivotally attached to a handle 120. The bracket has a first end 102A and a second end 102B. The handle 120 includes a locking element 126 located at the second end 102B.

Figure 1B:
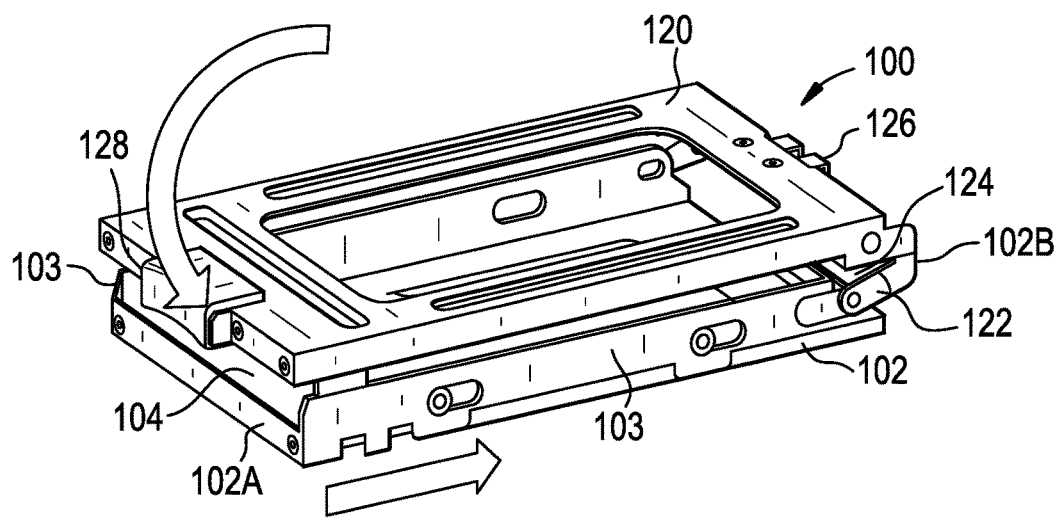
Figure 1C:
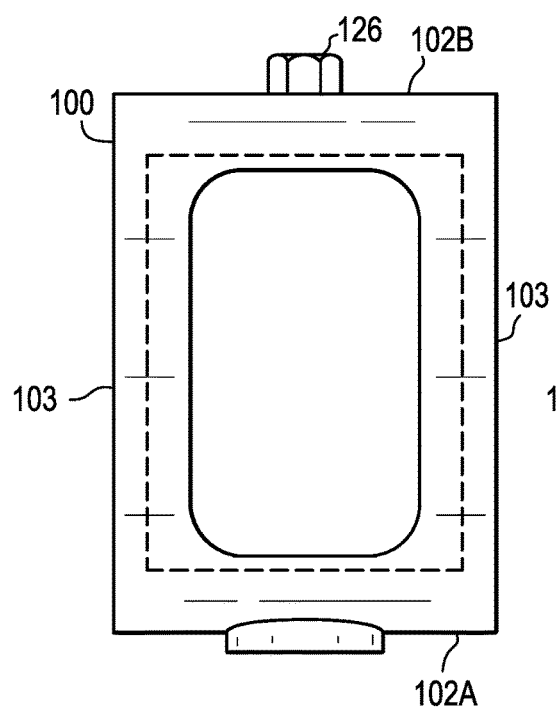
Figure 1D:
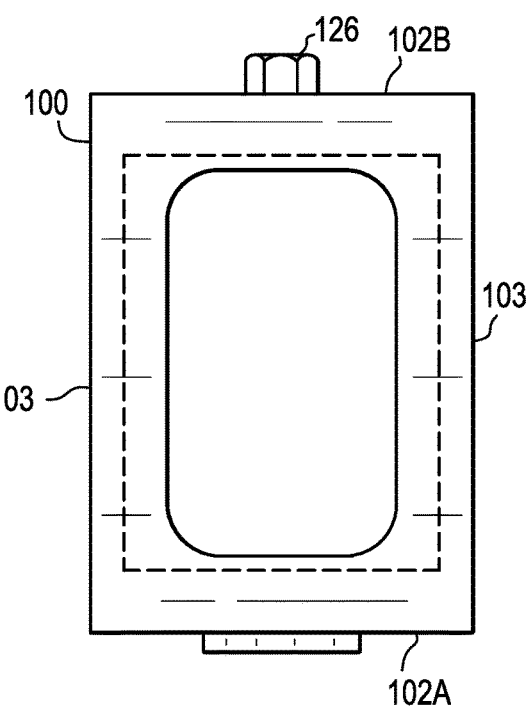
Figure 10:
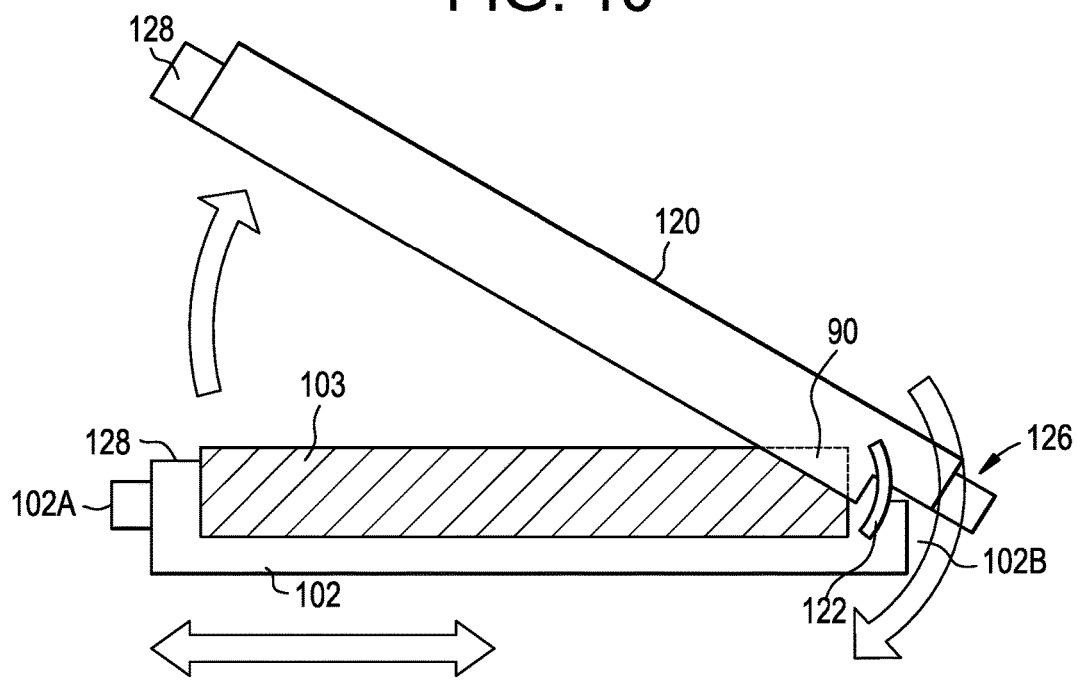
FIG. 10 shows an illustration of removing the hard drive carrier from the drive slot.

In the exemplary configuration of FIGS. 1A-1D, the handle 120 is attached to the bracket 102 by the linkage 122 so as to allow the handle 120 to enclose the receiving space 104. In the enclosure of the receiving space 104, an angle of rotation 124 for handle 120 is defined. The linkage 122 is located at the second end 102B. The handle 120 can be configured to alternate between a loading position, as shown in FIG. 1A, and a locked position, as shown in FIG. 1B. In the locked position, the handle 120 is swung towards the first end 102A. In the configuration of FIGS. 1A-1D, the handle 120 is substantially symmetric. That is, the handle 120 is attached to each side of bracket 102 via the linkage 122. The linkage 122 is an assembly of bodies connected to manage forces and movement. The linkage 122 is considered to be rigid. Moreover, the handle is pivotally attached to the plates 103 via a pivot point 90 (FIG. 10). The plates 103 can serve as an enclosure slidably encompassing the bracket 102. The movement of the linkage 122 draws the bracket 102 with respect to the plates 103, while the pivot point 90 secures the plates in a stationary orientation with respect to the handle 120. The connections between links within the linkage 122 provide sliding, and are called joints. The linkage 122 is modeled as a network of rigid links.

The handle 120 is attached to each side of bracket 102 by the linkage 122 and plates 103 by the pivot point 90. Due to the linkage 122 and the pivot point 90, the plates 103 slide relative to the bracket by guide pins, horizontal grooves, or rivets and slots, 103A and 103B. Such a configuration is provided for ease of installation of the HDD 106 in carrier 100. When the handle 120 is in the loading position (FIG. 1A) the linkage 122 is extended to position the bracket 102 towards the first end 102A. In particular, the linkage 122 can be used for initial placement of the HDD 106 within the receiving space 104. When the handle 120 is in the locked position (FIG. 1B) the linkage 122 is engaged to position the bracket 102 towards the second end 102B, securing the HDD 106 within bracket 102.

Figure 8:
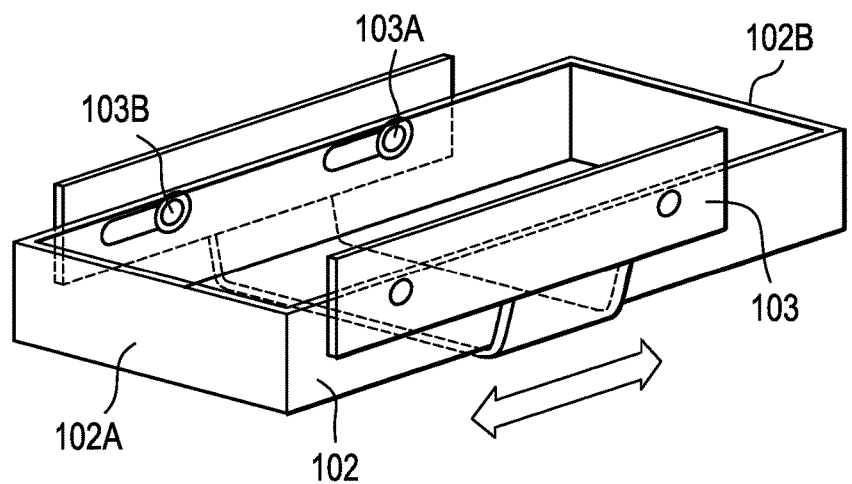
FIG. 8 shows an illustration of the plates slidably connected to the bracket of the hard drive carrier.

FIG. 8 illustrates the plates 103 relative to the bracket 102. The plates 103 can be connected to one another beneath the bracket 102 to ensure the plates 103 move in unison with respect to the bracket 102. The plates 103 are slidably attached to the bracket 102 by guide pins, horizontal grooves, or a pin-insertion portion and a pin-retaining portion, 103A and 103B. In some embodiments, the plates 103 can include guide pins configured to be inserted within the bracket 102. The bracket 102 can include horizontal grooves positioned and arranged so that the guide pins of the plates 103 can slide into the horizontal groove when the handle 120 transitions from the loading position to the locked position. This will be described below in greater detail. However, it should be noted that the configuration of the plates 103 is not limited to that illustrated in FIG. 8 and can be configured in other ways and provide the same functionality. For example, the plates 103 can be slidably attached to the bracket 102 by a pin-insertion portion and a pin-retaining portion.

The linkage 122 can be implemented in a variety of ways. One exemplary configuration is illustrated in FIGS. 1A-1D. In the exemplary configuration, the linkage 122 is pivotably attached to the bracket 102. The linkage 122 has a closed position and an open position. In the open position, the linkage 122 positions the bracket 102 towards the first end 102A. Furthermore, the linkage 122 in the open position takes on a horizontal line shape. In the closed position, the linkage 122 positions the bracket 102 towards the second end 102B. Furthermore, the linkage 122 in the closed position takes on an L shape.

Figure 11:
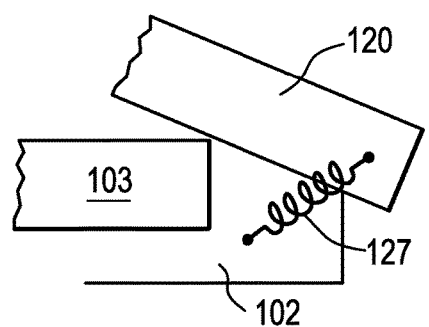
FIG. 11 shows an illustration of an alternative tool-less, spring-loaded mechanism provided to interlock the handle and the bracket.

It should be noted that the present disclosure contemplates that the bracket 102 can be positioned towards the second end 102B, securing the HDD 106 within bracket 102 using mechanisms other than a mechanical linkage. FIG. 11 shows, for example, a tool-less, spring-loaded mechanism provided to position the bracket towards the second end 102B. These mechanisms are presented by way of example and not by way of limitation. Specifically, the present disclosure contemplates securing the HDD 106 within bracket 102 can be accomplished using any other mechanisms than those discussed above. Further, the present disclosure contemplates that the bracket 102 can be positioned towards the second end 102 using any combination of mechanisms.

To secure the handle 120 in the closed position, the linkage 122 and the handle 120 can include a latch element 128 and a locking element 126. In the exemplary configuration of FIGS. 1A-1B, the latch element 128 is configured as a spring latch that engages a corresponding locking element 128B when the handle 120 is in the horizontal position. The latch element 128 disengages the corresponding locking element 128B when the spring latch is released. Upon engagement with a corresponding locking element 128B, the handle 120 is in the locked position. However, the present disclosure contemplates that any other type of mechanism can be used for latch element 128. Further, although the exemplary HDD carrier 100 shows only a single latch element 128 at the first end 102A of the handle 120, the present disclosure contemplates that the number and position(s) of locking elements can vary. For example, a locking element may be located at either side to secure the handle 120 in the locked position.

In the exemplary configuration of FIGS. 1A-1B, the locking element 126 is configured as a hook that engages a corresponding locking element 504 (FIGS. 7A-7C) located at a drive slot. Although the exemplary HDD carrier 100 shows only a U-shaped recess at the second end 102B of handle 120, the present disclosure contemplates other implementations can be employed. The use and operation of handle 120 and the locking element 126 will be discussed below in greater detail.

Figure 2:
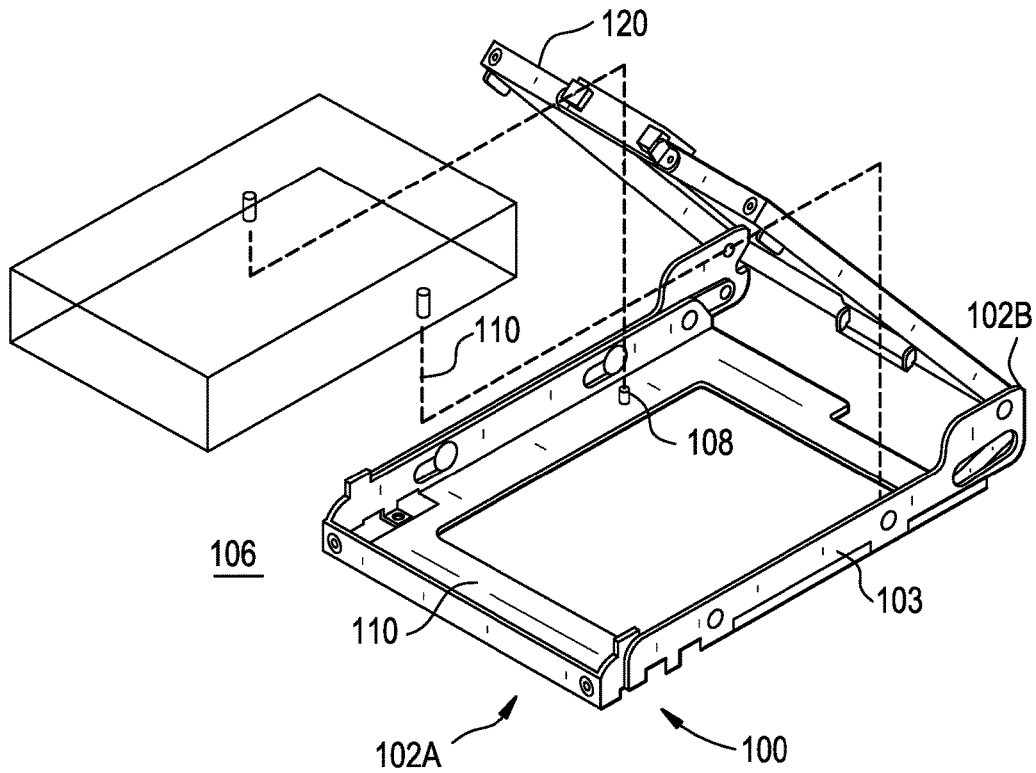
FIG. 2 shows the HDD carrier of FIG. 1 prior to securing the HDD in the HDD carrier.
Figure 3:
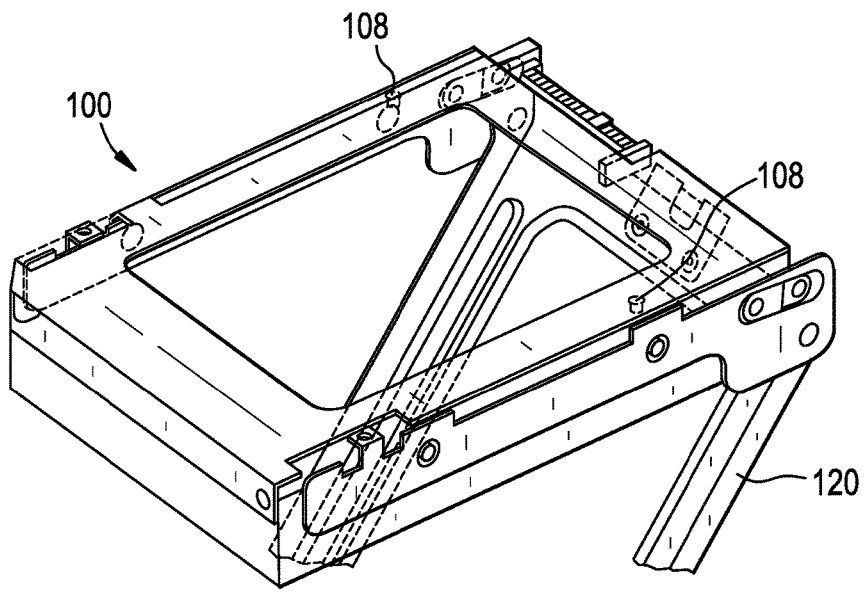
FIG. 3 shows the bottom view of the HDD carrier of FIG. 1 subsequent to insertion of a HDD.

Now turning to FIGS. 2 and 3, in HDD carrier 100, the HDD 106 is secured therein using a plurality of guide pins 108. The plurality of guide pins 108 are arranged in the HDD carrier 100 so that the positions of the guide pins 108 correspond to openings or indentations 110 in HDD 106. For example, in the configuration illustrated in FIG. 2, the indentations 110 are the standard threaded openings for a HDD. However, the various embodiments are not limited in this regard and the plurality of guide pins 108 and 110 can be arranged to correspond to any other features of HDD.

With regards to FIGS. 2 and 3, the operation of some aspects of the HDD carrier 100 of FIGS. 1A-1D is illustrated. FIG. 2 shows the HDD carrier of FIG. 1 subsequent to insertion of a HDD and prior to securing the HDD in the HDD carrier. FIG. 3 shows the bottom view of the HDD carrier of FIG. 1 prior to securing the HDD in the HDD carrier and positioning the handle 120 in the locked position.

Referring back to FIG. 1A, a HDD 106 is inserted into the receiving space 104 while the latch element 128 is not engaged with the first end 102A of handle 120 and the handle 120 is in the loading position. Thus, the HDD 106 is positioned in the receiving space 104 based on the positions of the guide pins 108, the first end 102A and second end 102B of bracket 102, and the plates 103 that move relative to the bracket 102. This configuration is illustrated in FIG. 1A. It should be noted that although the configuration of FIG. 1A shows that the handle 120 is at an acute angle at the axis of rotation 124, the position of handle 120 during loading of an HDD 106 into the receiving space 104 can vary depending on the length, configuration and other components of HDD carrier 100.

Figure 4A:
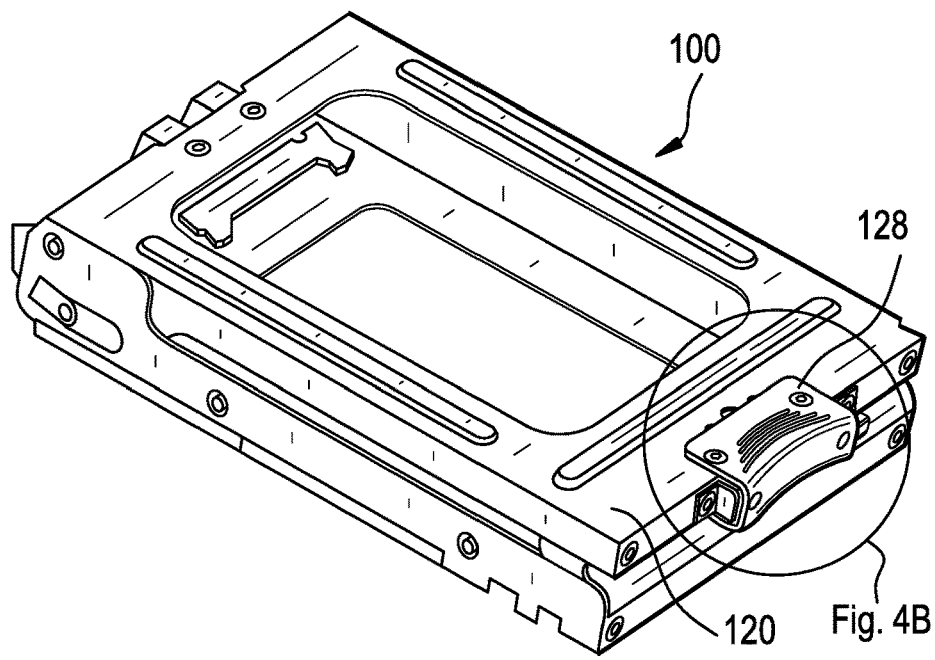
FIGS. 4A and 4B show the HDD carrier of FIG. 1 were the latch element is engaged and the HDD carrier is configured in a locked position according to an embodiment.
Figure 4B:
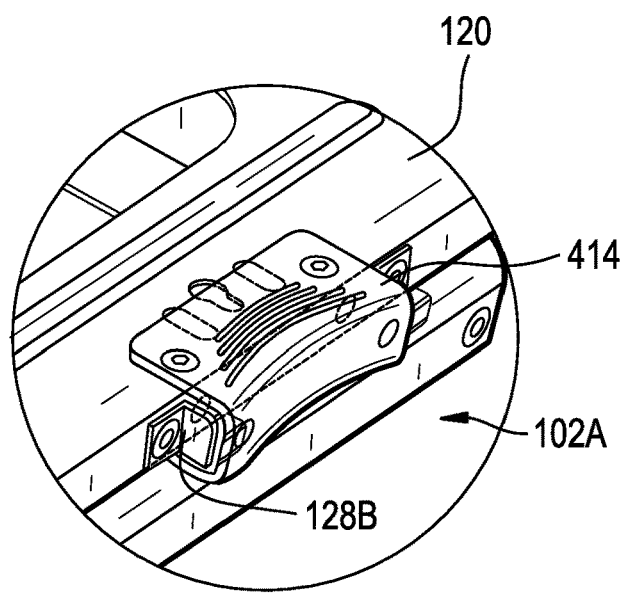
Figure 5:
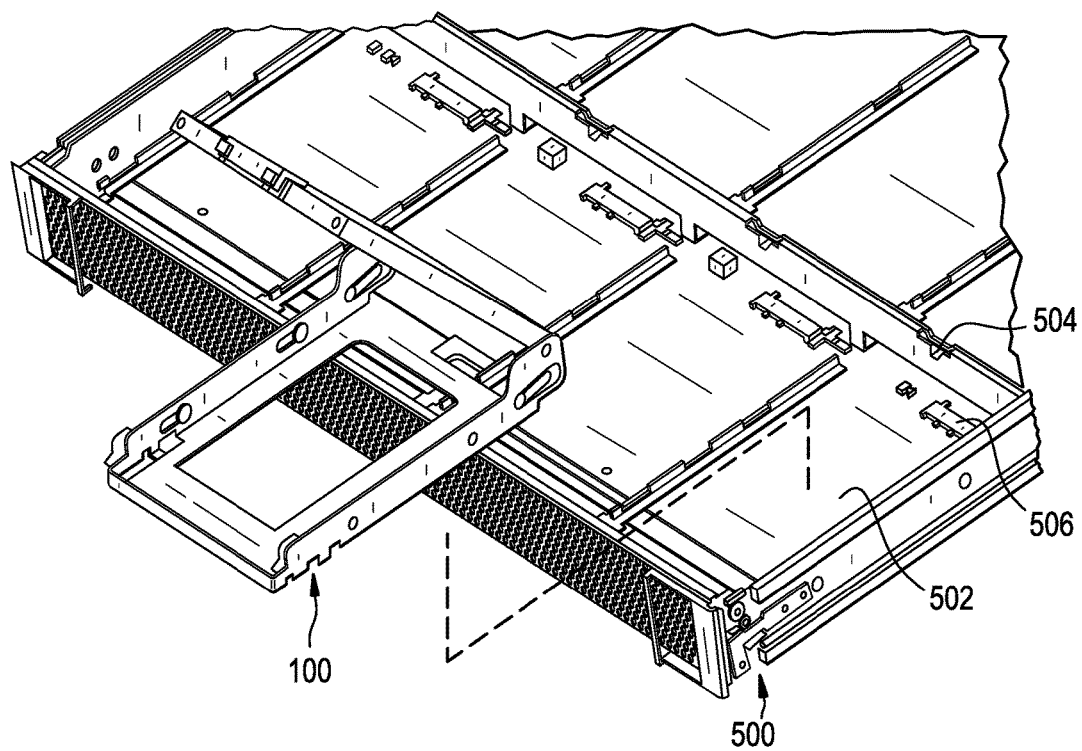
FIG. 5 shows the HDD carrier of FIG. 1 prior to insertion into a drive slot within a chassis according to an embodiment.

Now referring to FIG. 4, the latch element 128 can be adapted to engage a corresponding latch element 128B when the handle 120 is in the horizontal position and that disengages the corresponding locking element when the latch element 128 is released, resulting in the locked and loaded positions. For example, latch element 128 can comprise securing prongs 414 that engage with a corresponding locking element 128B at the first end 102A. In some embodiments of the invention, the first end 102A of the HDD carrier 100 can comprise securing apertures (not pictured) adapted to engage with securing prongs 414. Pushing on latch element 128 can cause the securing prongs 414 to disengage from the securing apertures of the first end 102A to enable the handle 120 to be lifted into the loading position. In some embodiments of the invention, the latch element 128 can be spring loaded such that it returns back to its original position after being engaged or disengaged to/from the corresponding locking element 128B at the first end 102A.

Now that the configuration and operation of the HDD carrier 100 has been described, the disclosure now turns to a description of the configuration and operation of drive slots for receiving HDD carrier 100. This is described below with respect to FIGS. 5, 6, and 7A-7C.

Figure 6:
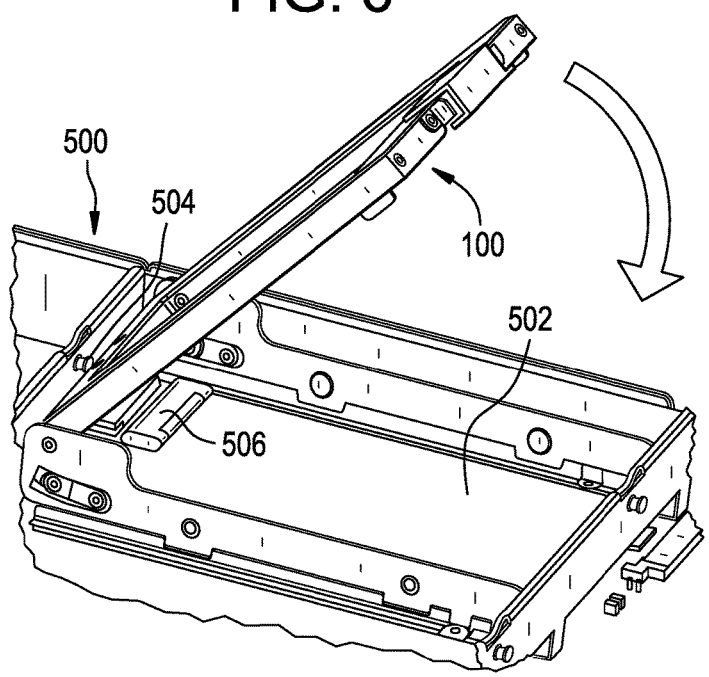
FIG. 6 shows the HDD carrier of FIG. 1 inserted into a drive slot within a chassis according to an embodiment.

FIGS. 5, 6, and 7A-7C show the HDD carrier of FIG. 1 being inserted into a drive slot 502 within a chassis 500 and configured in a loading position according to an embodiment. FIG. 6 shows a detailed view of HDD carrier 100 in drive slot 502 of FIG. 6.

The HDD carrier 100 is configured for insertion into a drive slot 502 of a computing device 500. The computing device can be a standalone computer, a server, or any other type of computing device. The drive slot 502 includes a locking element 504, and a hard drive connector 506. The drive slot 502 can be disposed in a chassis or enclosure (not illustrated for clarity).

Figure 7A:
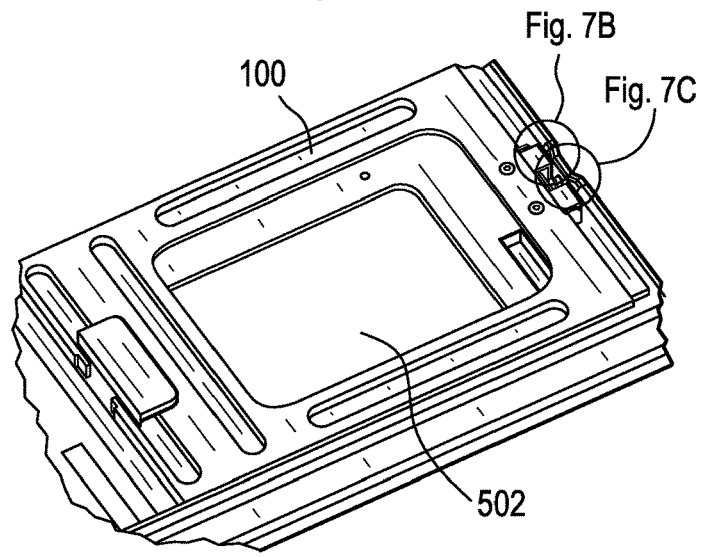
FIGS. 7A, 7B, and 7C show the engagement of the locking elements when the HDD carrier of FIG. 1 is inserted into a drive slot within a chassis according to an embodiment.
Figure 7B:
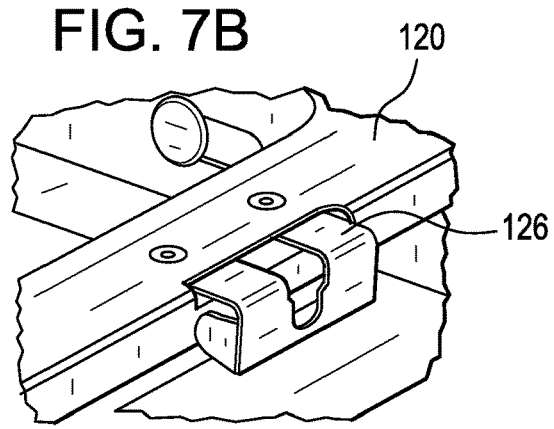
Figure 7C:
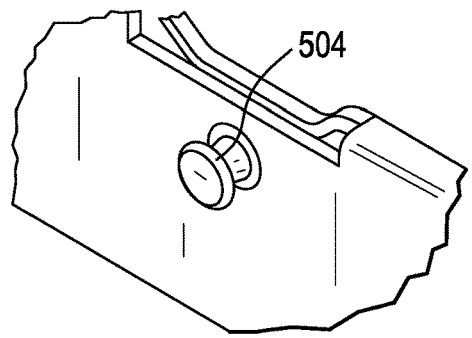

FIGS. 7A-7C show the HDD carrier 100 of FIG. 1 inserted into a drive slot 502 and configured in a locked position according to an embodiment. In the locked position, the HDD carrier 100 is configured so that the handle 120 is in a horizontal position, as illustrated in FIG. 7A. As further shown in FIGS. 7A-7C, the locking element 126 connected to the handle 120 engages with the locking element 504 of the drive slot 502. Furthermore, the handle 120 connected to the bracket 102 secures the hard drive 106 within the receiving space 104. In this configuration, the interaction of the locking element 126 of the HDD carrier and the locking element 504 of the drive slot 502 operates to cause a connector of the drive slot 502 to engage the connector of the HDD 106.

In the exemplary configuration of FIGS. 7A-7C, the locking element 126 is configured as a u-shaped hook that engages a corresponding knob when the handle 120 is in the horizontal position. However, the present disclosure contemplates that any other type of mechanism can be used for the locking element 126 and the corresponding locking element 504. For example, the locking element 126 and the corresponding locking element 504 can be guide rails and corresponding indentations, a plurality of guide pins located on the bracket 102 of the HDD carrier 100, and other implementations. This process is described in greater detail below.

In discussing the transition of the HDD carrier 100 of FIG. 1 from a loading position to a locked position after insertion into a drive slot 502, reference will be made to FIGS. 1A, 1B, and 10. Some reference numerals of features of the HDD carrier 100 and drive slot 502 are not provided to avoid obscuring details or to facilitate explanation and illustration. However, these features correspond to the same features of the preceding figures.

FIG. 1A illustrates the HDD carrier 100 in the loading position. In the loading position, the handle 120 is in a vertical position, i.e., extending away from the drive slot 502. As discussed above, since the handle 120 is attached to each side of the bracket 102 via the linkage 122 and the plates 103 via the pivot point 90, the bracket 102 moves independent of the plates 103. Because of pivot point 90 connecting the handle 120 and the plates 103, the plates 103 are stationary with respect to the bracket 102. The position of the handle 120 will cause the position of the bracket 102 with respect to the plates 103 to change. In the loading position, the linkage 122 is more or less parallel to the drive slot 502. Thus, the bracket 102 is positioned towards the first end 102A enabling enough space to insert the hard drive 106 in the receiving space 104. In this position, no part of the hard drive 106 or the hard drive carrier 100 will engage a hard drive connector 506 of the drive slot 502.

As the handle 120 is rotated and the locking element 126 is engaged with the corresponding locking element 504, the linkage 122 and pivot point 90 will position the bracket 102 and the hard drive 106 loaded into the receiving space 104 towards the closed position. Since the position of the sides 103 is fixed with respect to the handle 120 and the bracket 102 due to pivot point 90, the force applied by the linkage 122 will translate into horizontal motion of the bracket 102 and then the hard drive 106 in the hard drive carrier 100. In particular, the force will cause, as shown in FIG. 1B, the linkage 122 to displace the bracket 102 and completely enclose the hard drive 106 within the hard drive carrier 100. The horizontal motion of the bracket 102 and the receiving space 104 will also cause the hard drive 106 to move towards the hard drive connector 506.

Referring now to FIG. 1B, the locked position, as the handle 120 is brought completely into the locked (horizontal) position, the linkage 122 continues to exert force against the bracket 102 which causes further horizontal motion of the hard drive 106 within the hard drive carrier 100. In the exemplary configuration of FIG. 1B, the handle 120, the hard drive 106, the hard drive connector 506, the hard drive carrier 100, the locking element 126 and the corresponding locking element 504 are arranged so that once the handle is in the locked position: (1) the locking elements 126 and 504 engage with each other to prevent motion of handle 120 (in either direction) and (2) the hard drive connector 506 engages with a corresponding connector on hard drive 106 so as to connect hard drive 106 to the computer system associated with drive slot 502. Since at this point the bracket 102 and the hard drive 106 are constrained, the hard drive connector 506 and the corresponding connector on the hard drive 106 can engage safely and reliably without concern for damaging either connector.

Figure 9:
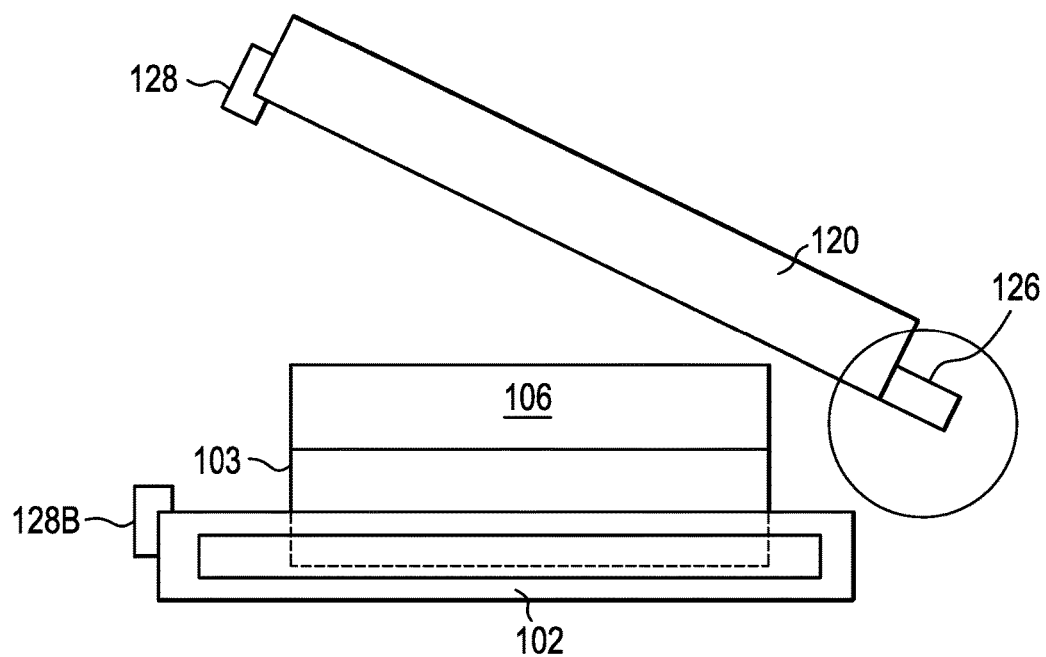
FIG. 9 schematically shows an exploded view of the components of the HDD carrier of FIG. 1.

FIG. 9 is an exploded view of the main components of hard drive carrier 100 including the bracket 102, slides 103 and the handle 120, provided for understanding. FIG. 10 shows an illustration of removing the hard drive carrier 100 from the drive slot 502. To remove the hard drive carrier 100 from drive slot 502, the process is reversed. First, the latch element 128 and a locking element 126 are disengaged to position the handle 120 towards the loading position. In the disengagement, the locking elements 126 and 504 are also disengaged from each other to allow the hard drive carrier 100 to be moved. Thereafter, the handle 120 is transitioned from the locked position to the loading position, which causes the linkage 122 to apply force against the bracket 102, which in turn causes horizontal motion of the bracket 102 and the connected receiving space 104 in an opposite direction. This horizontal motion of the bracket 102 and the connected receiving space 104 is independent of the plates 103 via pivot point 90. In this way, the horizontal motion causes the hard drive connector 506 to safely disengage a corresponding connector of the hard drive 106. Once the handle 120 is in the loading position, the hard drive carrier 100 can be lifted out of the drive slot 502.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A computing device, comprising:
    at least one drive slot, the at least one drive slot comprising at least one connector for engaging a corresponding hard disk drive, and a first locking element; and
    a hard drive carrier for removable insertion into the at least one drive slot, the hard drive carrier comprising:
        a bracket for securing the hard disk drive in a receiving space and having a second locking element extending therefrom and configured to receive the first locking element of the at least one drive slot and configured to restrict the removable hard drive carrier to vertical motion when the second locking element engages with the first locking element, the second locking element having a U-shaped hook to engage with the first locking element,
        an enclosure slidably attached to the bracket, and
        a handle having a first end mechanically attached to one end of the bracket, pivotally attached to the enclosure, and configured to alternate between a loading position and a locked position, the U-shaped hook located on a second end of the handle, wherein the second locking element engages with the first locking element when the handle is in the loading position and the bracket moves relative to the enclosure to secure the hard disk drive in the bracket and connect the connector of a hard disk drive to the at least one connector located at the at least one drive slot when the handle transitions from the loading position to the locked position.

2. The computing device of claim 1, wherein the second locking element comprises a hook, and wherein the first locking element comprises a knob configured to engage with the hook.

3. The computing device of claim 1, wherein the first locking element comprises a hook, and wherein the second locking element comprises a knob configured to engage with the hook.

4. The computing device of claim 1, wherein the bracket comprises a plurality of guide pins for receiving and securing the hard disk drive in the receiving space.

5. The computing device of claim 1, wherein the bracket comprises the receiving space for receiving the hard disk drive and a plurality of protrusions extending into the receiving space and arranged to correspond with a plurality of indentations of the hard disk drive to secure the hard disk drive in the receiving space.

6. The computing device of claim 1, wherein the handle comprises at least one latch configured to secure the handle in the locked position.

7. The computing device of claim 1, wherein the handle is pivotably attached to one end of the bracket by a linkage.

8. A hard drive carrier comprising:
a bracket for securing the hard disk drive in a receiving space and having a first locking element extending therefrom and configured to receive a second locking element of a computing device comprising at least one drive slot, the at least one drive slot comprising at least one connector for engaging a corresponding hard disk drive, the first locking element having a U-shaped hook to engage with the second locking element,
an enclosure slidably attached to the bracket, and
a handle having a first end pivotably attached to one end of the bracket and configured to alternate between a loading position and a locked position, the U-shaped hook located on a second end of the handle, wherein the first locking element engages with the second locking element when the handle is in the loading position and the bracket moves relative to the enclosure to secure the hard disk drive in the bracket and connect the connector of a hard disk drive to the at least one connector located at the at least one drive slot when the handle transitions from the loading position to the locked position.

9. The hard drive carrier of claim 8, wherein the handle comprises at least one latch configured to secure the handle in the locked position.

10. The hard drive carrier of claim 8, wherein the second locking element comprises a hook, and wherein the first locking element comprises a knob configured to engage with the hook.

11. The hard drive carrier of claim 8, wherein the first locking element comprises a hook, and wherein the second locking element comprises a knob configured to engage with the hook.

12. The hard drive carrier of claim 8, wherein the bracket comprises a plurality of guide pins for receiving and securing the hard disk drive in the receiving space.

13. The hard drive carrier of claim 8, wherein the receiving space comprises a plurality of protrusions extending into the receiving space and arranged to correspond with a plurality of indentations of the hard disk drive to secure the hard disk drive in the receiving space.

14. The hard drive carrier of claim 8, wherein the handle is pivotably attached to one end of the bracket by a linkage.

* * * * *